United States Patent
Poulton et al.

(10) Patent No.: US 6,720,895 B2
(45) Date of Patent: Apr. 13, 2004

(54) METHOD OF CALIBRATING AN ANALOG-TO-DIGITAL CONVERTER AND A CIRCUIT IMPLEMENTING THE SAME

(75) Inventors: Kenneth D. Poulton, Palo Alto, CA (US); Robert M. R. Neff, Palo Alto, CA (US); Matthew S. Holcomb, Colorado Springs, CO (US); James Kang, Monmouth Junction, NJ (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/061,138

(22) Filed: Feb. 1, 2002

(65) Prior Publication Data

US 2003/0146861 A1 Aug. 7, 2003

(51) Int. Cl.[7] ............................................. H03M 1/10
(52) U.S. Cl. ....................... 341/120; 341/155; 341/159; 341/166
(58) Field of Search ................................. 341/120, 143, 341/166, 159, 155

(56) References Cited

U.S. PATENT DOCUMENTS

| | | | | |
|---|---|---|---|---|
| 5,012,244 | A | * | 4/1991 | Wellard et al. ............. 341/120 |
| 5,465,092 | A | | 11/1995 | Mayes et al. |
| 5,499,027 | A | * | 3/1996 | Karanicolas et al. ........ 341/120 |
| 5,668,549 | A | * | 9/1997 | Opris et al. ................. 341/118 |
| 5,677,692 | A | * | 10/1997 | Hasegawa ................... 341/120 |
| 5,889,487 | A | * | 3/1999 | Burns et al. ................ 241/159 |
| 5,929,796 | A | | 7/1999 | Opris et al. |
| 6,215,436 | B1 | * | 4/2001 | Ottini et al. ................ 341/155 |
| 6,232,898 | B1 | | 5/2001 | Nagaraj |

FOREIGN PATENT DOCUMENTS

| | | |
|---|---|---|
| EP | 0 460 840 A2 | 12/1991 |
| JP | 10-145231 | 5/1998 |
| WO | WO 96/09692 | 3/1996 |

OTHER PUBLICATIONS

Hughes, et al., "A Low Voltage 8–Bit, 40MS/S Switched–Current Pipeline Analog–to–Digital Converter", 2001, IEEE, pp. I–572–I–575.

Carreira, et al., "A Compact Three–Step Pipelined CMOS Current–Mode A/D Converter", 1997 IEEE, International Symposium on Circuits and Systems, Jun. 9–12, 1997, pp. 465–468.

Karanicolas, et al., "A 15–b 1–Msample/s Digitally Self–Calibrated Pipeline ADC", IEEE Journal of Solid–State Circuits, vol. 28, No. 12, Dec. 1993, pp. 1207–1215.

"Digitizing Waveform Recorders", IEEE Trial–Use Standard for Digitizing Waveform Recorders, IEEE Std. 1057, Issued Jul. 1989 for trial use, pp. 21–22.

Press, et al., "Numerical Recipes in C, The Art of Scientific Computing", Cambridge University Press, Cambridge, pp. 528–539.

(List continued on next page.)

*Primary Examiner*—Michael Tokar
*Assistant Examiner*—Lam T. Mai
(74) *Attorney, Agent, or Firm*—Herbert R. Schulze (57) ABSTRACT

A method of calibrating a high-speed analog to digital converter and an ADC that implements the method. Multiple linear regression analysis is used to calibrate the stages of a pipeline ADC to compensate for variations in gain from stage to stage and optionally to compensate for harmonic distortion. Current amplifiers each having gain of about 1.6 are used for low power consumption, minimal surface area requirements, and rapid sampling speed. Weighting factors are stored in lookup tables to minimize the number of adders required to generate the output digital word.

15 Claims, 6 Drawing Sheets

OTHER PUBLICATIONS

Walpole, et al., "Multiple Linear Registration", Probability and Statistics for Engineers and Scientists, 2nd Edition, pp. 314–319.

Nigaraj, K., "Area–Efficient Self–Calibartion Technique for Pipe–Lined Algorithmic A/D Converters", IEEE Transactions on Curcuits and Systems–11: Analog and DIgital Signal Processing, Col. 43, No. 7, Jul. 1996, pp. 540–544.

Gatti, Umberto et al., "Improving the Linearity in High–Speed Analog–to–Digital Converters", IEEE 1998, pp. I–17–I–20

Karanicolas, Andrew N. et al., "A 15–b 1–Msample/s Digitally Self–Calibarted Pipeline ADC", IEEE Journal of Solid–State Circuits, vol. 28, No. 12, Dec. 1993, New York, pp. 1207–1215.

* cited by examiner

METHOD OF CALIBRATING AN ANALOG-TO-DIGITAL CONVERTER AND A CIRCUIT IMPLEMENTING THE SAME

This invention pertains generally to digital electronics and more particularly to high-speed analog-to-digital converters.

BACKGROUND

Many electronic applications require conversion of analog signals into digital signals. This is done by sampling the instantaneous value of the analog signal periodically and then representing each of these instantaneous values in digital form. If the periodic sampling rate is at least twice the highest frequency present in the analog signal, no information is lost in the sampling, as taught by the Shannon theorem. An electronic device that accomplishes this sampling and converts the samples to digital form is known as an Analog-to-Digital Converter (ADC).

For example, a well-known application of the ADC is to record music on a compact disk (CD). Musical instruments produce analog (continuously varying) sounds. These sounds are converted into an analog electrical signal by a microphone. In turn this analog electrical signal may be converted into digital form by sampling it periodically and representing the value of each sample as a binary number. The value of such an analog signal at a first sampling time might be 0.01 volt, at the next sampling time 0.1 volts, and at the next sampling time 0.5 volts. Represented as binary numbers with 8-bit resolution, these values are 0000 0001, 0000 0110, and 0011 0010, respectively. The human ear cannot hear frequencies higher than about 20 kiloHertz (kHz), so if the analog musical signal is sampled with sufficient resolution at least twice that fast—40,000 samples per second—virtually all the perceptible information in the original signal will be faithfully preserved in the digital conversion. Commercial CDs are recorded with digital signals obtained at a slightly higher sampling rate of 44,000 samples per second.

As operating frequencies of electronic devices have grown higher and higher, there has developed a corresponding need for a way to convert analog signals into digital form at sampling rates of many millions of samples per second. This has posed numerous difficulties for circuit designers, especially in crafting small, low-power devices that can be implemented as integrated circuits (ICs).

One approach to implementing a small, low-power, high-speed ADC has been the "pipeline" architecture. In the simplest pipeline ADC, a sampled value of an analog input signal is applied to a first pipeline stage where it is compared with a reference voltage to generate the most significant bit (MSB) of the digital output signal. This bit is converted into an analog value that is subtracted from the sample value to provide a residue. The residue is amplified and applied to a second pipeline stage wherein the preceding process is repeated to generate the next MSB, and so on through each successive pipeline stage to the least significant bit (LSB). The gain of each amplifier stage must be exactly two in order to get an accurate binary digital representation of the analog input signal.

Karanicolas, Lee and Bacrania in "A 1-b 1-Msample/s Digitally Self-Calibrated Pipeline ADC", *IEEE Journal of Solid-State Circuits,* Vol. 28, No. 12, December 1993, propose an ADC having a pipeline architecture but with an amplifier stage gain of 1.93 rather than two. This ADC includes a simple radix conversion (error-correction) circuit to compensate for the gain of the amplifier stages being slightly less than two. This ADC offers a sampling rate of one million samples per second (MSa/s).

More recently, a pipeline ADC as disclosed by Carreira, Dupuy and Franca in "A Compact Three-Step Pipelined CMOS Current-Mode A/D Converter", *IEEE International Symposium on Circuits and Systems,* 1997, page 465, has achieved a sampling rate of 54 MSa/s. This device employs relatively complex multiple-bit flash converters in each pipeline stage.

An example of a high-speed ADC that employs a pipeline structure with single-bit converters in each pipeline stage is provided by Hughes, Mee and Donaldson in "A Low Voltage 8-Bit, 40 MS/S Switched-Current Pipeline Analog-to-Digital Converter", *IEEE International Symposium on Circuits and Systems,* 2001, page I-572. The device proposed by Hughes et al. achieves a maximum sampling rate of 40 MSa/s.

It is possible to design high-speed current amplifiers from which one could fabricate an ADC having a sampling rate in excess of 54 MSa/s. However, it has been difficult to operate such amplifiers at the desired switching speeds with low power, and it has been difficult to accurately fix the gain of such amplifiers during fabrication. Accordingly, there remains a need for a way to fabricate an ADC that can accurately convert an analog signal into a digital one, that can achieve sampling rates substantially higher than 54 MSa/s, and that can be economically implemented in a low-power circuit on a small IC.

SUMMARY OF THE INVENTION

The invention provides a method of using multiple linear regression analysis to calibrate a pipeline ADC having a plurality of amplifier stages each with gain less than two. Such an ADC calibrated in this manner operates at switching speeds more than twice as fast as speeds that have been achieved by other ADCs, uses very low power, and can be economically fabricated in a very small area of an integrated circuit.

In one aspect of the invention, an analog calibration signal is applied to an ADC to obtain a plurality of codes, multiple linear regression analysis is performed on the codes to generate a plurality of weighting factors, and these weighting factors are then stored for later use.

It may be desirable to use the weighting factors to calculate register values and then store these register values in a set of lookup tables. Optionally, register values for a most-significant-bits lookup table are calculated during the multiple linear regression analysis to reduce any harmonic distortion.

Higher-order terms may be generated during the multiple linear regression analysis and used to calculate harmonic distortion correction values. These values are then stored, for example in a post-processing lookup table, for use in reducing any harmonic distortion in the digital output signal.

A method of converting an analog input signal into a digital output signal according to another aspect of the invention includes applying an analog calibration signal to an ADC to obtain a plurality of codes, performing multiple linear regression analysis on the codes to generate a plurality of weighting factors, storing the weighting factors, applying the to-be-converted analog input signal to the ADC to obtain radix bits, and using the stored weighting factors to convert the radix bits into the digital output signal.

Storing the weighting factors may include calculating register values and storing these values in a set of lookup tables, and values in the lookup tables are then used to convert the radix bits into the digital output signal.

As described above, higher-order terms may be generated during the multiple linear regression analysis and used to calculate harmonic distortion correction values. These values are used to reduce any harmonic distortion in the digital output signal.

In another aspect, the invention provides an analog-to-digital converter having current-mode pipeline stages that provide a plurality of radix bits according to an analog input signal and a radix conversion circuit that converts the radix bits into a digital output signal according to a plurality of weighting factors derived by multiple linear regression analysis of a calibration signal.

In one instance, the radix conversion circuit includes a plurality of registers each of which receives one of the radix bits and provides a weighted signal in response, and an adder to add the weighted signals from the registers to provide the digital output signal.

The analog-to-digital converter may include a post-processing distortion correction circuit that applies a plurality of harmonic distortion correction values derived from higher-order terms generated during the multiple linear regression analysis of the calibration signal to reduce harmonic distortion in the digital output signal.

In another instance, the radix conversion circuit includes look-up table registers each of which receives several of the radix bits and provides a weighted signal in response, and an adder to add the weighted signals from the look-up table registers to provide the digital output signal.

Other aspects and advantages of the invention will become apparent from the following detailed description, taken in conjunction with the accompanying drawings, illustrating by way of example the principles of the invention.

DESCRIPTION OF THE PREFERRED EMBODIMENTS

As shown in the drawings for purposes of illustration, the invention is embodied in a novel method of calibrating an analog-to-digital converter (ADC) by multiple linear regression analysis. This method of calibration makes it possible to fabricate a current-mode pipelined ADC that operates at a sampling speed in excess of 100 MSa/s, requires very low power, and needs very little area on an IC chip.

Figure 1:
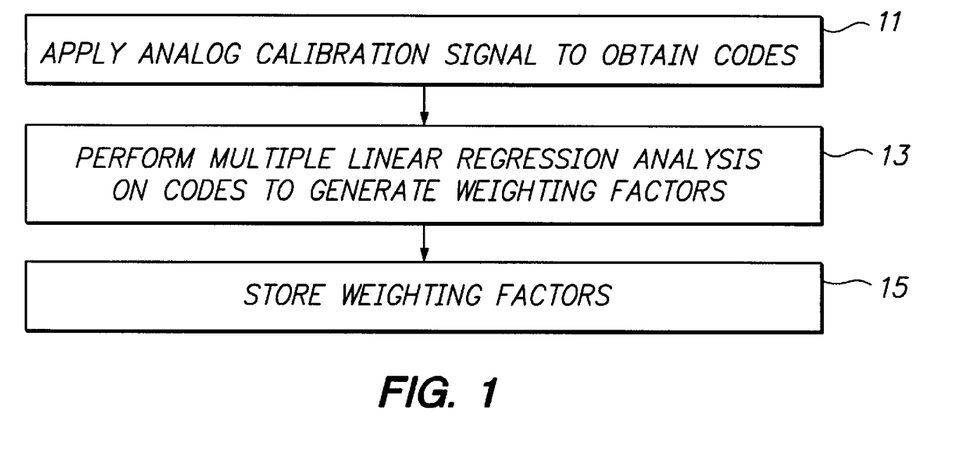
FIG. 1 is a flowchart of a method according to the invention of calibrating an analog-to-digital converter.

Referring to FIG. 1, a method of calibrating an ADC includes applying an analog calibration signal to the ADC to obtain a plurality of codes (block 11), performing multiple linear regression analysis on the codes to generate a plurality of weighting factors (block 13) and storing the weighting factors (block 15).

Figure 2:
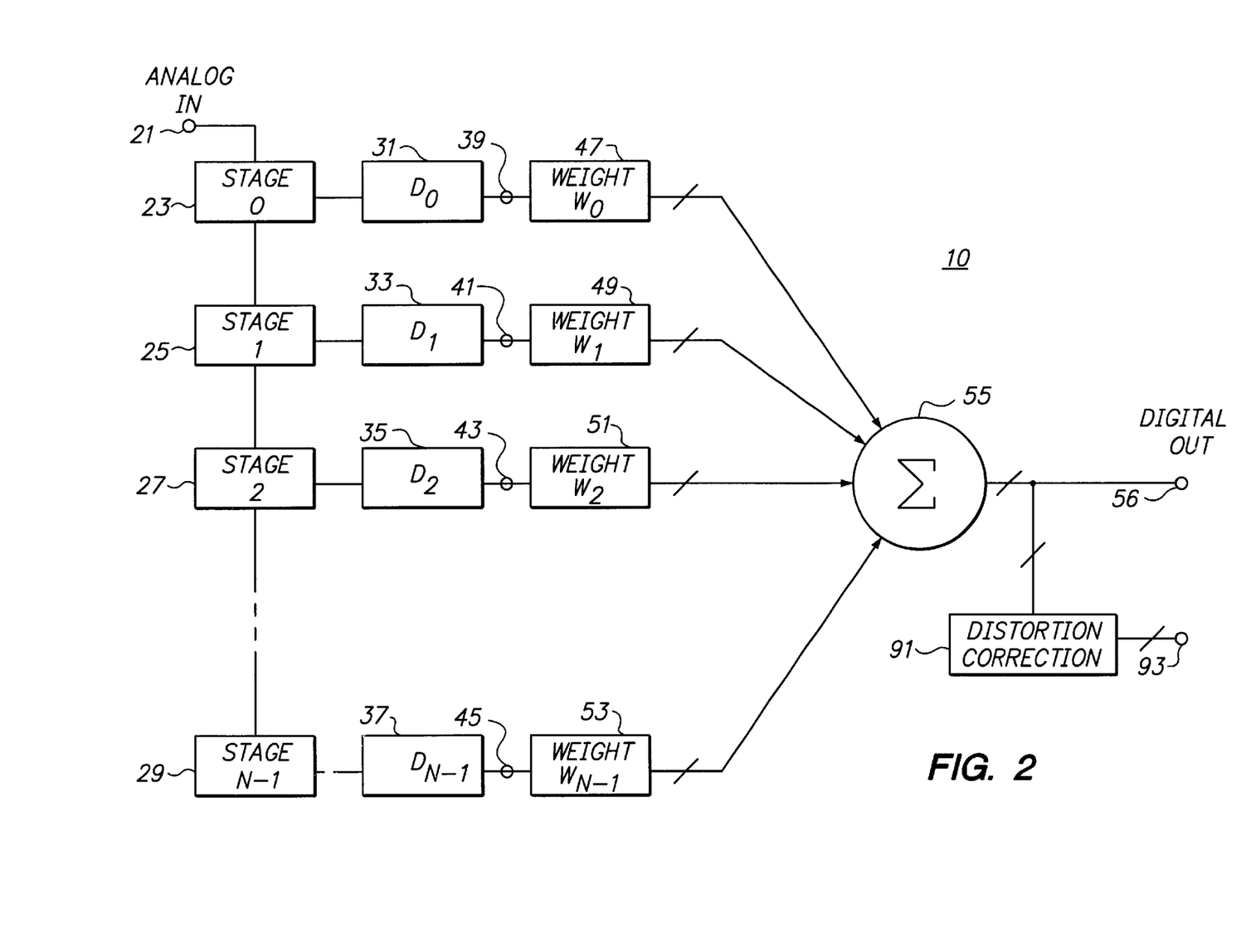
FIG. 2 is a block diagram of an embodiment of an ADC according to the invention.

FIG. 2 illustrates in block diagram form how the foregoing method may be implemented in an N-stage pipelined ADC generally 10. An analog input 21 receives an analog signal. This signal passes through a series of N pipeline stages 23 (stage 0), 25 (stage 1), 27 (stage 2) and 29 (stage N−1). Each stage has gain between one and two; in one embodiment a nominal gain of 1.6 is used. Typically these pipeline stages are sequentially clocked by a set of interleaved clock signals. In this case the outputs of the various stages must be delayed by varying amounts as indicated by delay lines 31, 33, 35 and 37 to provide a set of N bits at pipeline stage outputs 39 through 45.

Throughout this description, the bits provided at the pipeline stage outputs will be referred to as "code bits" when provided in response to a calibration signal and "radix bits" when provided in response to an input signal (an "input signal" is a signal that is applied to the ADC to be converted into a digital signal).

The ADC is calibrated by applying an analog calibration signal, such as a sine wave, a ramp signal, or a succession of D.C. voltages from an external signal source (not shown) to the analog input 21. The calibration signal should be free of any distortion. The calibration signal passes through the pipeline stages 23 through 29 where it is converted into a first set of code bits $B_{0,0}$ through $B_{0,N-1}$ which are provided at the stage outputs 39–45. The calibration signal is sampled M times to generate M sets $B_0$ through $B_{M-1}$ of code bits with N bits per sample. The values of these code bits are inserted into the following set of equations:

$$W_0 B_{0,0} + W_1 B_{0,1} + \cdots + W_{N-1} B_{0,N-1} + W_{dc} = V_0$$

$$W_0 B_{1,0} + W_1 B_{1,1} + \cdots + W_{N-1} B_{1,N-1} + W_{dc} = V_1$$

$$\cdots$$

$$W_0 B_{M-1,0} + W_1 B_{M-1,1} + \cdots + W_{N-1} B_{M-1,N-1} + W_{dc} = V_{M-1}$$

where:

$W_a$ is the a-th desired weighting factor, $B_{f,g}$ is the bit provided from the f-th calibration sample by the g-th stage, $W_{dc}$ is a constant DC bias, and $V_f$ is the value of the f-th calibration sample at the analog input 21.

Multiple linear regression analysis, also known as general least squares fitting, is used to compute the best weighting factors $W_0$ through $W_{N-1}$ from these equations. Techniques of multiple linear regression analysis are described in such publications as Walpole and Myers, *Probability and Statistics for Engineers and Scientists* ($2^{nd}$ ed), Chapter 9, MacMillan: 1978, and Press et al., *Numerical Recipes in C*, chapter 14.3, Cambridge: 1988. The weighting factors are stored.

In one embodiment the first weighting factor $W_0$ is stored in a first register 47, the next weighting factor is stored in a register 49, the next in a register 51, and so on through the N-th register 53.

Figure 3:
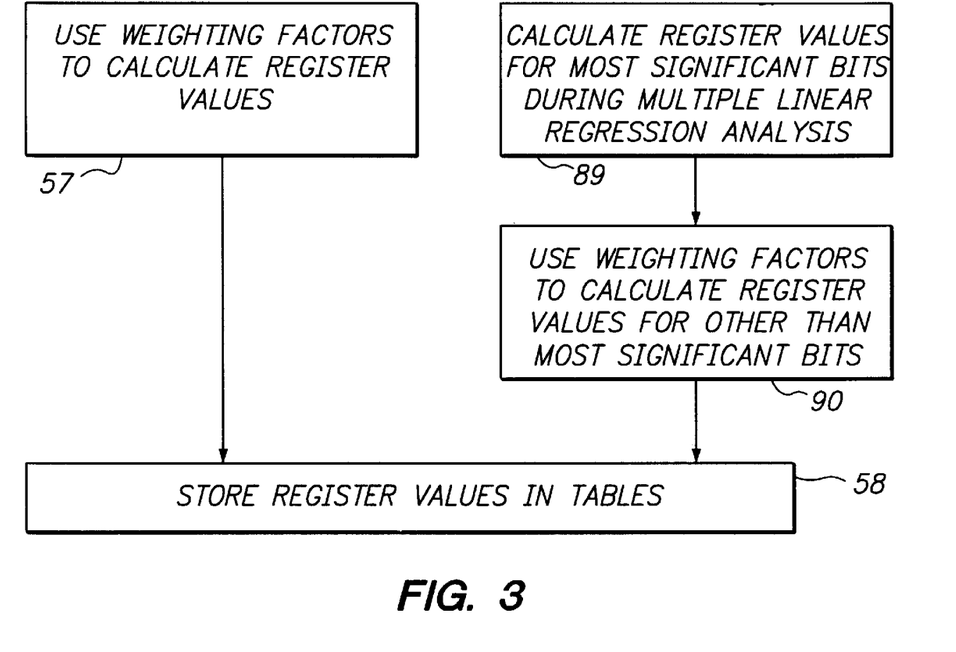
FIG. 3 is a flowchart of an embodiment of the last step in FIG. 1.

In operation of the ADC 10, weighting factors from those of the registers for which the respective stages 23–29 have generated a radix bit with a value of one are summed in an adder 55 to provides a digital word at an output 56. A potential drawback is that the adder 55 must be able to add as many as N weighting factors each containing up to N bits to provide the digital output. As shown in FIG. 3, this can be ameliorated by calculating a plurality of register values from the weighting factors (block 57) and storing these register values in a plurality of lookup tables (block 58). The register values for a given lookup table are simply those values which together constitute all possible outputs for any combination of inputs to the table.

Figure 4:
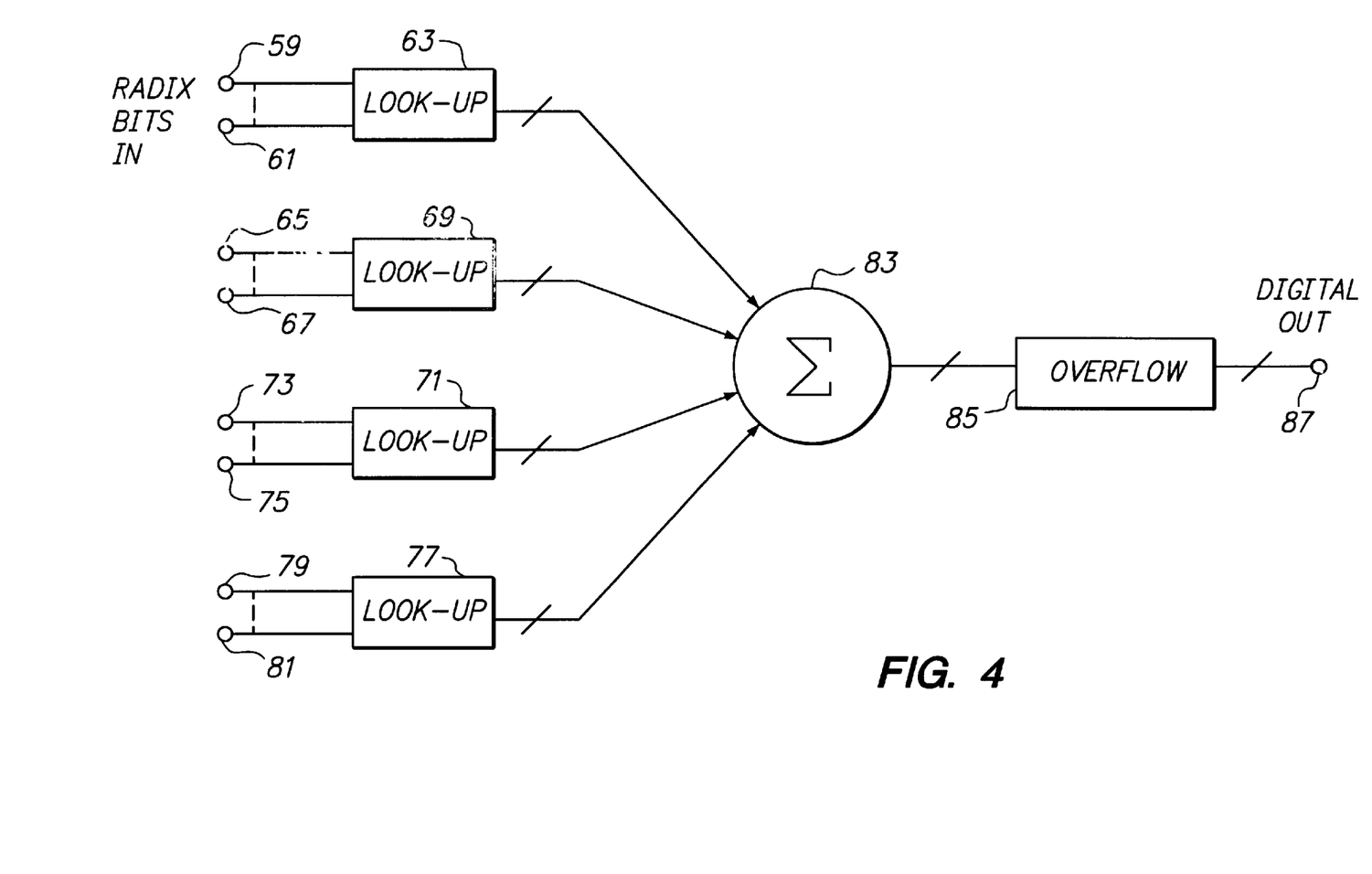
FIG. 4 is a block diagram of a digital radix converter and look-up table configuration for use in an ADC according to the invention.

FIG. 4 illustrates this approach in block diagram form. Radix bits from a first set of pipeline stages are applied to inputs 59 through 61 of a first lookup table 63. Similarly, radix bits from a second set of pipeline stages are applied to inputs 65 through 67 of a second lookup table 69, and so on. Two more lookup tables 71, with inputs 73 and 75, and 77, with inputs 79 and 81, are shown for purposes of illustration. Using four lookup tables, a total of twelve radix bits can be applied to the tables—three radix bits to each table—and each table in turn will provide an 8-bit word in response to any combination of input bits. It will be apparent that any number of tables could be used; however, the advantages of using lookup tables will only be realized if the total number of tables is less than N. The outputs of the lookup tables are summed in an adder 83 and as needed the sum is truncated in an overflow register 85 to provide a digital output word at an output 87.

The circuit shown in FIG. 4 is typically faster and uses less power than the circuit of FIG. 2 because it requires less adder circuitry. However, it may require somewhat more IC surface area.

It will be apparent that other arithmetic circuitry, or software, could also be used to apply the weighting factors to the bits from the N stages to provide the digital output word.

Distortion in any circuitry that precedes the pipeline stages of the ADC can cause undesirable changes in the weighting factors that in turn can cause steps in the ADC voltage transfer function. It is possible to take advantage of the implementation of the radix converter shown in FIG. 4 to reduce such errors. Instead of extracting weighting factors for the most significant bits and using those factors to pre-compute the register values to be stored in the first look-up table 61 (this table corresponds with the most significant bits of the digital output) as per block 57 of FIG. 3, the register values for this table may be computed during the multiple linear regression analysis (block 89) and the register values for the remaining tables determined as described above (block 90). This is explained as follows for the case of a look-up table that receives the three most significant radix bits and provides an 8-bit word in response:

$$W_8 B_{8,0} + \text{- - -} + W_0 B_{0,0} + W_{dc} + W_{111} B_{111,0} + W_{110} B_{110,0} + \text{- - -} + W_{001} B_{001,0} = V_0$$

where:

$W_{bbb}$ represents the weighting factor for MSB code bbb, $B_{bbb}$ is 1 only if the three MSBs have the value bbb, and MSB code 000 is assigned weight 0.

This technique has been shown to reduce distortion by a factor of about 1.6 without any additional conversion steps.

Low-order harmonic distortion in the signal path can be removed entirely if the digital output signal can be post-processed. This may be done, either in hardware or in software, by means of a distortion correction table 91 as shown in FIG. 2. Distortion correction table 91 can be implemented as a look-up table that maps each possible output word to a new word with no distortion at an output 93. This requires removing the effects of distortion on the calibration signal. To do this, higher-order terms are added to the set of equations to be solved by multiple linear regression analysis, as the following example shows:

$$W_{11} B_{11,0} + W_{10} B_{10,0} + \text{- - -} + W_0 B_{0,0} + W_{dc} + HD_2(V_0)^2 + HD_2(V_0)^3 + \text{- - -} V_0$$

Figure 5:
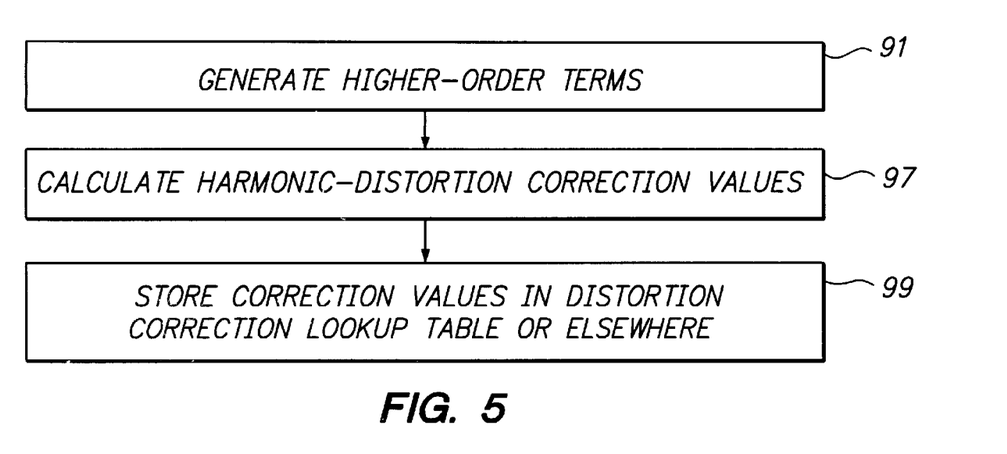
FIG. 5 is a flowchart of a method of reducing harmonic distortion in the method of FIG. 1.

As depicted in FIG. 5, these new higher-order terms $HD_2$ etc. are generated (block 91) along with the weighting factors $W_0$ through $W_{N-1}$. By introducing these terms, the low-order harmonic distortion, up to the number of terms used, will be extracted separately from the weighting factors, so the true bit weighting factors $W_0$ through $W_{N-1}$ will result from the calculations. The computation of the register values proceeds as described above. The HD terms are used to calculate harmonic distortion correction values (block 97) which are stored in the distortion correction table (block 99).

Figure 6:
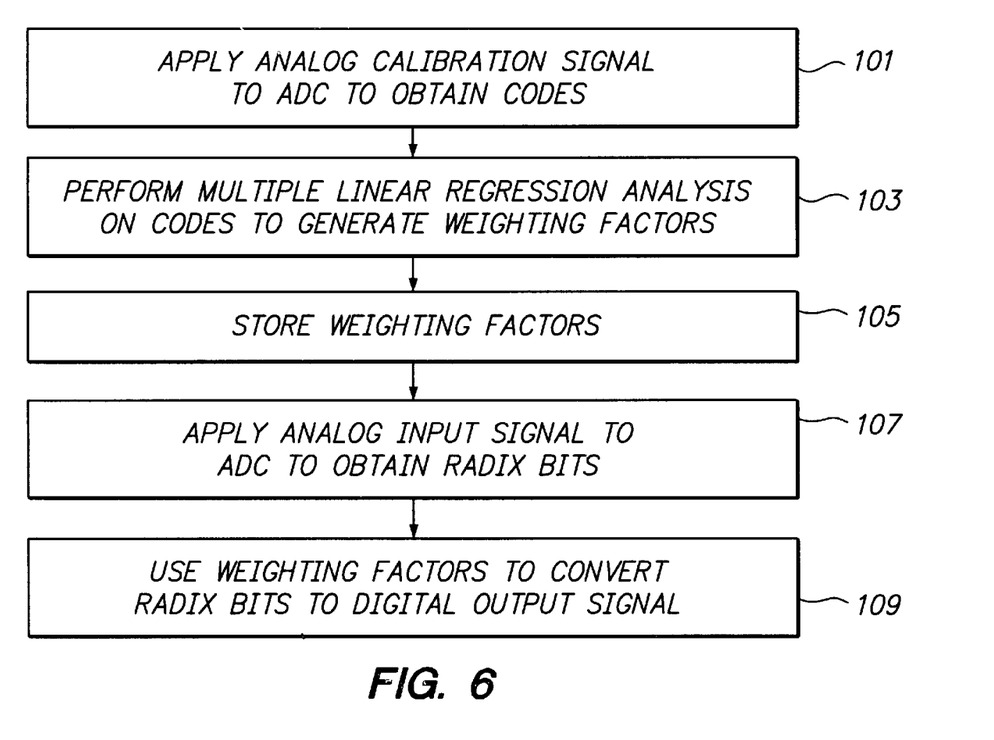
FIG. 6 is a flowchart of a method according to the invention of converting an analog signal into a digital signal.

Using the principles as described above, in one embodiment the invention provides a method of converting an analog input signal into a digital output signal as shown in FIG. 6. An analog calibration signal is applied to an analog-to-digital converter to obtain a plurality of codes (block 101). Multiple linear regression analysis is performed on the codes to generate a plurality of weighting factors (block 103). The weighting factors are stored (block 105). The analog input signal to be converted is applied to the analog-to-digital converter to obtain a plurality of radix bits (block 107). The stored weighting factors are used to convert the radix bits into the desired digital output signal (block 109).

Figure 7:
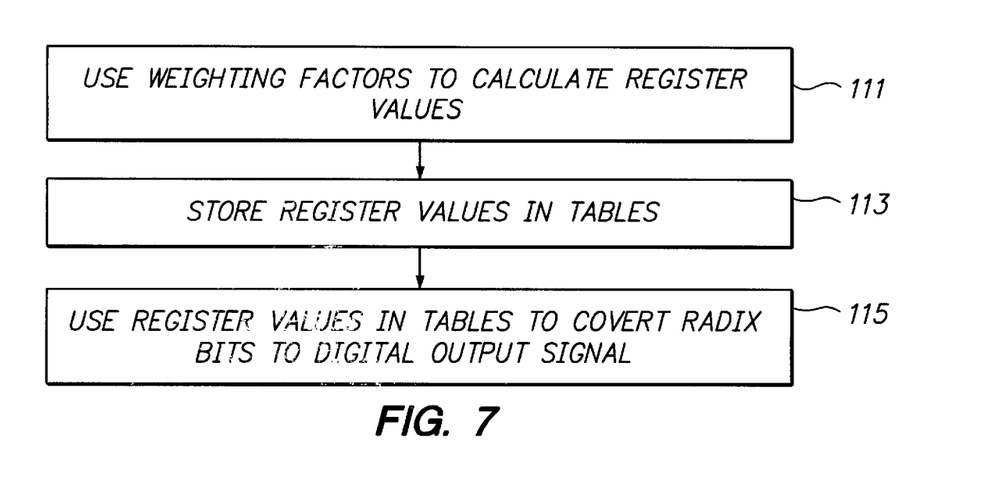
FIG. 7 is a flowchart of an embodiment of the third and fifth steps of FIG. 6.

As shown in FIG. 7, storing the weighting factors may be accomplished by calculating a plurality of register values from the weighting factors (block 111), storing the register values in a plurality of lookup tables (block 113) and using the register values stored in the lookup tables to convert the radix bits into the digital output signal (block 115).

Figure 8:
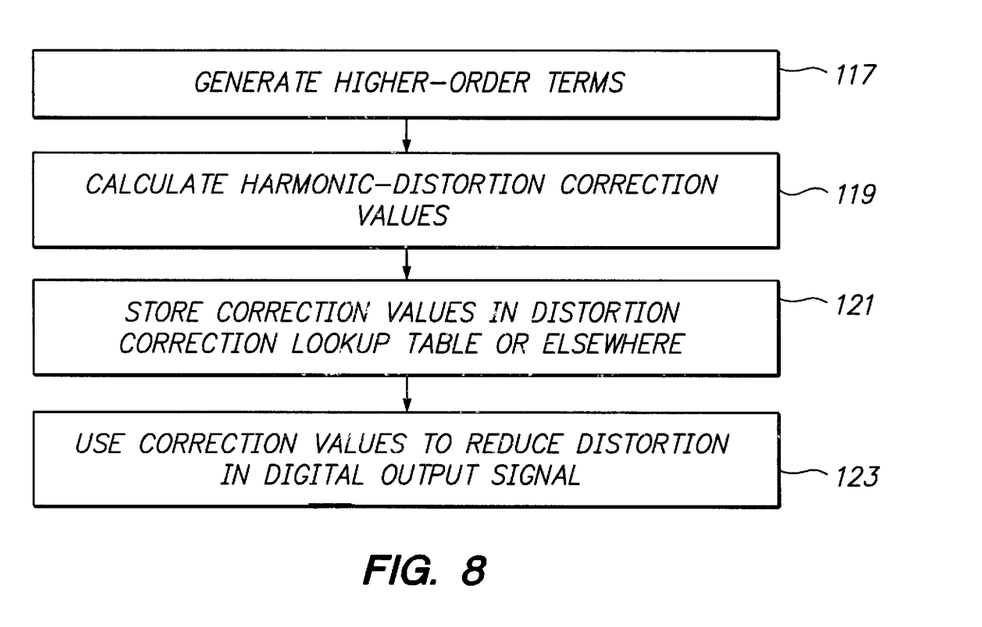
FIG. 8 is a flowchart of a method of reducing harmonic distortion in the digital output signal provided by the method of FIG. 6.

As shown in FIG. 8, harmonic distortion may be reduced by generating a plurality of higher-order terms during the regression analysis (block 117). Harmonic-distortion correction values are calculated from these higher-order terms (block 119) and are stored in a distortion correction table or elsewhere as desired (block 121). These harmonic distortion correction values are used to reduce harmonic distortion in the digital output signal (block 123).

An analog-to-digital converter according to the invention includes a plurality of current-mode pipeline stages that provide radix bits according to an analog input signal, and a radix conversion circuit that converts the radix bits into a digital output signal according to weighting factors derived by multiple linear regression analysis of a calibration signal. As described above, the radix conversion circuit may have a plurality of registers each of which receives one radix bit and provides a weighted signal in response, and an adder for summing the weighted signals from the registers to provide the digital output signal.

In another embodiment the radix conversion circuit includes look-up table registers each of which receives several of the radix bits and provides a register value in response. The register values are then summed to provide the digital output signal.

A post-processing distortion correction circuit may be used to reduce harmonic distortion. This circuit applies harmonic distortion correction values that were derived from higher-order terms generated during the multiple linear regression analysis of the calibration signal, thereby reducing harmonic distortion in the digital output signal.

Figure 9:
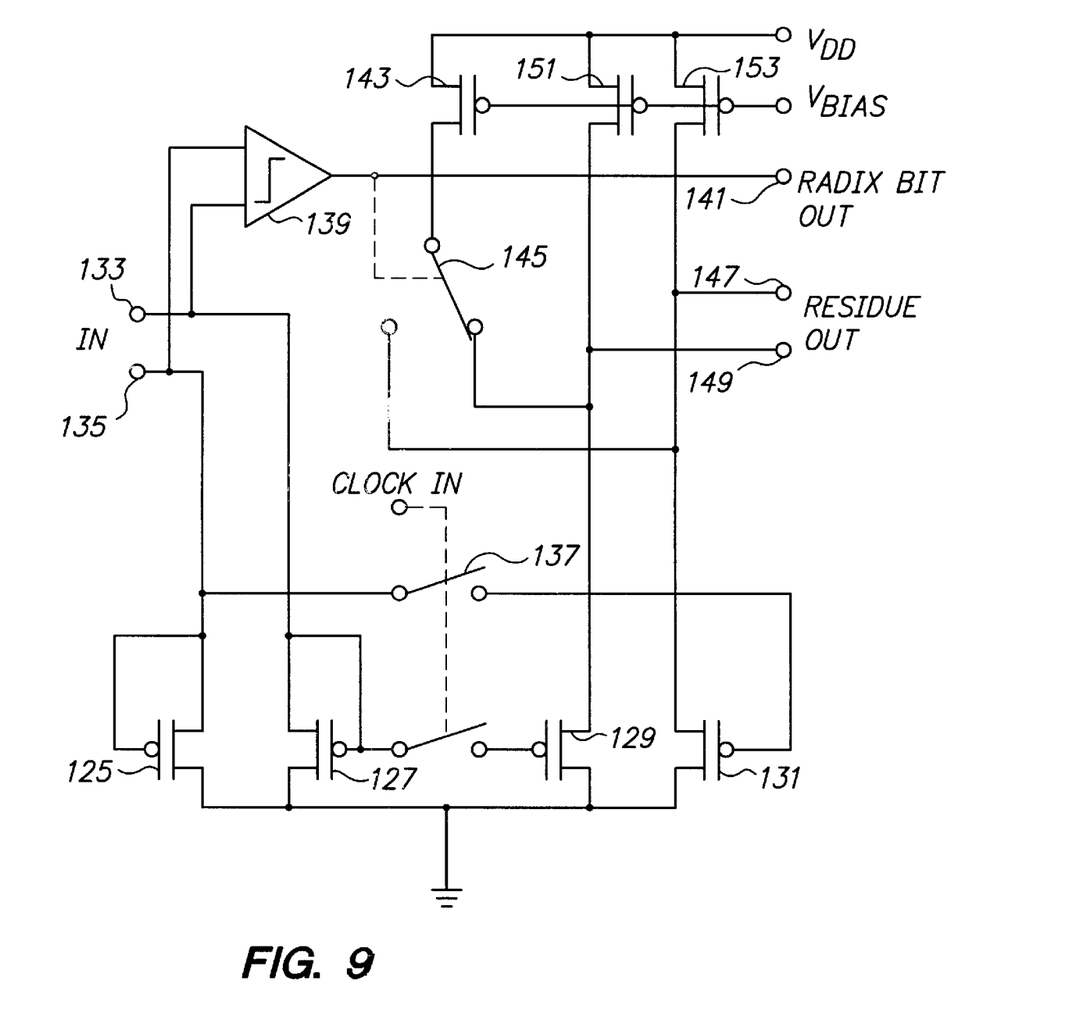
FIG. 9 is a partial schematic diagram of a current-mode amplifier stage for an ADC according to the invention.

A low-current, high-speed amplifier suitable for use in the stages of an ADC implementing the invention is shown in FIG. 9. A sample-and-hold circuit consisting of a pair of FETs 125 and 127 configured as a current mirror and a second pair of FETs 129 and 131 also configured as a current mirror receives an analog input at ports 133 and 135. The instantaneous value of this input is sampled and then held under control of a clock signal as indicated by a switch 137.

The analog input is also applied to a comparator 139 which provides the radix bit output from the stage at a port 141 and serves as a digital-to-analog converter by switching the polarity of a bias current provided through a FET 143. This switched polarity bias is applied to the FETs 129 and 131 as indicated by a switch 145 to effectively subtract the value of the radix output bit from the input signal. The residue from this subtraction is provided at output ports 147 and 149 to be passed to the next stage. FETs 151 and 153 provide bias currents to the current mirror FETs 129 and 131, respectively. Cascoding FETs can be placed in the drain circuit of any or all of the FETs shown to increase the speed or accuracy of this stage.

The sample-and-hold circuit has a relatively low gain of about 1.6. An advantage of this low gain is that it provides redundancy (error tolerance). The gain need not be precisely controlled during fabrication because the techniques of the invention as described above will provide any necessary correction.

A pipeline ADC implemented as described above with 12 stages each having gain about 1.6 has been fabricated and provides an output with 8-bit linearity at a sampling rate of 125 MSa/s. It dissipates 60 milliwatts and uses an area of 0.3 mm$^2$ on an IC chip.

Although certain embodiments of the invention have been described and illustrated, the invention is not to be limited to the specific forms or arrangements of parts so described and illustrated. For example, the invention has been described with reference to embodiments that use look-up tables to generate digital words, but it will be apparent that in other embodiments such digital words may be generated by computations that are carried out in software or by other means. Also, the invention has been described with reference to a pipeline ADC that produces one bit per stage with a stage gain between one and two, but the principles of the invention are also applicable to ADCs that produce multiple bits per stage. Common cases are 1.5 bits per stage where each stage has two comparators and a gain of two, and K bits per stage where each stage has $2^{K-1}$ comparators and a gain between $2^{K-1}$ and $2^K$. The invention is limited only by the claims.

We claim:

1. A method of calibrating an analog-to-digital converter comprising:
    applying an analog calibration signal to the analog-to-digital converter to obtain a plurality of codes;
    performing multiple linear regression analysis on the codes to generate a plurality of weighting factors; and
    storing the weighting factors.

2. A method as in claim 1 wherein the step of storing the weighting factors comprises calculating a plurality of register values from the weighting factors and storing the register values.

3. A method as in claim 2 wherein calculating a plurality of register values comprises calculating register values for a most-significant-bits lookup table during the multiple linear regression analysis to reduce any harmonic distortion.

4. A method as in claim 1 wherein the step of generating the plurality of weighting factors comprises generating a plurality of first-order terms and a plurality of higher-order terms.

5. A method of calibrating an analog-to-digital converter comprising:
    applying an analog calibration signal to the analog-to-digital converter to obtain a plurality of codes;
    performing multiple linear regression analysis on the codes to generate a plurality of weighting factors, generating the plurality of weighting factors comprising generating a plurality of first-order terms and a plurality of higher-order terms;
    storing the weighting factors; and
    calculating a plurality of harmonic-distortion correction values from the higher-order terms and storing the harmonic distortion correction values.

6. A method as in claim 5 wherein storing the harmonic distortion correction values comprises storing said values in a post-processing lookup table.

7. A method of converting an analog input signal into a digital output signal, comprising:
    applying an analog calibration signal to an analog-to-digital converter to obtain a plurality of codes;
    performing multiple linear regression analysis on the codes to generate a plurality of weighting factors;
    storing the weighting factors;
    applying the analog input signal to the analog-to-digital converter to obtain a plurality of radix bits; and
    using the stored weighting factors to convert the radix bits into the digital output signal.

8. A method as in claim 7 wherein:
    the step of storing the weighting factors comprises calculating a plurality of register values from the weighting factors and storing the register values, and
    the step of using the stored weighting factors comprises using the register values to convert the radix bits into the digital output signal.

9. A method as in claim 7 wherein the step of generating the plurality of weighting factors comprises generating a plurality of first-order terms and a plurality of higher-order terms.

10. A method of converting an analog input signal into a digital output signal, comprising:
    applying an analog calibration signal to an analog-to-digital converter to obtain a plurality of codes:
    performing multiple linear regression analysis on the codes to generate a plurality of weighting factors, generating the plurality of weighting factors comprising generating a plurality of first-order terms and a plurality of higher-order terms;
    storing the weighting factors;
    applying the analog input signal to the analog-to-digital converter to obtain a plurality of radix bits;
    using the stored weighting factors to convert the radix bits into the digital output signal; and
    calculating a plurality of harmonic distortion correction values from the higher-order terms and storing the harmonic distortion correction values.

11. A method as in claim 10 and further comprising using the stored harmonic distortion correction values to reduce harmonic distortion in the digital output signal.

12. An analog-to-digital converter comprising:
    a plurality of current-mode pipeline stages that provide a plurality of radix bits according to an analog input signal; and
    a radix conversion circuit that receives the radix bits and converts them into a digital output signal according to a plurality of weighting factors derived by multiple linear regression analysis of a calibration signal.

13. An analog-to-digital converter as in claim 12 wherein the radix conversion circuit comprises:
    a plurality of registers each operative to receive one radix bit and provide a weighted signal in response thereto; and
    an adder operative to add the weighted signals from the registers to provide the digital output signal.

14. An analog-to-digital converter as in claim 12 and further comprising a distortion correction circuit that applies a plurality of harmonic distortion correction values derived from higher-order terms generated during the multiple linear regression analysis of the calibration signal to reduce any harmonic distortion in the digital output signal.

15. An analog-to-digital converter comprising:

a plurality of current-mode pipeline stages that provide a plurality of radix bits according to an analog input signal; and a radix conversion circuit that receives the radix bits and converts them into a digital output signal according to a plurality of weighting factors derived by multiple linear regression analysis of a calibration signal, the radix conversion circuit comprising a plurality of look-up tables each operative to receive a plurality of radix bits and provide a weighted signal in response thereto; and an adder operative to add the weighted signals from the look-up tables to provide the digital output signal.

* * * * *